(12) United States Patent
Froment et al.

(10) Patent No.: US 12,328,896 B2
(45) Date of Patent: Jun. 10, 2025

(54) SEMICONDUCTOR INTEGRATED CIRCUIT COMPONENT

(71) Applicant: STMicroelectronics (Crolles 2) SAS, Crolles (FR)

(72) Inventors: Benoit Froment, Grenoble (FR); Thomas Cabout, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 629 days.

(21) Appl. No.: 17/505,340

(22) Filed: Oct. 19, 2021

(65) Prior Publication Data

US 2022/0131005 A1 Apr. 28, 2022

(30) Foreign Application Priority Data

Oct. 23, 2020 (FR) ...................................... 2010911

(51) Int. Cl.
*H10D 30/60* (2025.01)
*H10D 30/01* (2025.01)
(Continued)

(52) U.S. Cl.
CPC ......... *H10D 30/615* (2025.01); *H10D 30/023* (2025.01); *H10D 62/235* (2025.01); *H10D 64/513* (2025.01)

(58) Field of Classification Search
CPC ........... H01L 29/7832; H01L 29/66484; H01L 29/1033; H01L 29/4236; H01L 29/7855;
(Continued)

(56) References Cited

U.S. PATENT DOCUMENTS 3,736,477 A * 5/1973 Berger .................... G11C 11/40
257/575
3,823,353 A * 7/1974 Berger ................. H03K 19/098
257/E29.186
(Continued)

FOREIGN PATENT DOCUMENTS

CN 107887429 A 4/2018
CN 110190123 A 8/2019
(Continued)

OTHER PUBLICATIONS

INPI Search Report and Written Opinion for FR 2010911 dated Sep. 11, 2019 dated Jul. 7, 2021 (9 pages).
(Continued)

*Primary Examiner* — Maliheh Malek
(74) *Attorney, Agent, or Firm* — Crowe & Dunlevy LLC (57) ABSTRACT

An integrated circuit includes a semiconductor substrate having a first type of conductivity and a semiconductor component. The semiconductor component includes: a buried semiconductor region having a second type of conductivity opposite to the first type of conductivity; a first gate region and a second gate region each extending in depth from a front face of the semiconductor substrate to the buried semiconductor region; a third gate region extending in depth from the front face of the semiconductor substrate and being electrically connected to the buried semiconductor region; and an active area delimited by the first gate region, the second gate region and the buried semiconductor region.

27 Claims, 8 Drawing Sheets

(51) Int. Cl.
*H10D 62/17* (2025.01)
*H10D 64/27* (2025.01)

(58) Field of Classification Search
CPC ..... H01L 21/823412; H01L 21/823437; H01L 23/57; H01L 27/088; H01L 23/576; H01L 21/76224; H01L 21/76816; H01L 21/76877; H01L 21/76895; H01L 23/481
See application file for complete search history.

(56) References Cited

U.S. PATENT DOCUMENTS

| | | | | |
|---|---|---|---|---|
| 4,716,314 | A * | 12/1987 | Mulder | H03K 19/091 257/E27.037 |
| 4,881,105 | A * | 11/1989 | Davari | H10D 30/025 257/334 |
| 5,420,447 | A * | 5/1995 | Waggoner | H10D 89/10 257/202 |
| 5,585,675 | A * | 12/1996 | Knopf | H01L 25/0657 257/723 |
| 5,780,883 | A * | 7/1998 | Tran | H10D 84/907 257/206 |
| 5,973,375 | A * | 10/1999 | Baukus | H01L 21/743 257/E21.538 |
| 6,841,813 | B2 * | 1/2005 | Walker | H10B 10/18 257/E27.102 |
| 7,241,655 | B2 * | 7/2007 | Tang | H10B 12/482 438/269 |
| 7,423,310 | B2 * | 9/2008 | Verhoeven | H10D 30/0413 257/E21.59 |
| 7,528,439 | B2 * | 5/2009 | Tang | H10D 30/025 257/E29.267 |
| 7,741,630 | B2 * | 6/2010 | Ufert | H10N 70/20 257/E47.001 |
| 7,859,026 | B2 * | 12/2010 | Ligon | H01L 21/2815 257/E21.375 |
| 8,350,318 | B2 * | 1/2013 | Grivna | H10D 30/645 257/329 |
| 8,471,331 | B2 * | 6/2013 | Iyer | H10D 30/0297 257/334 |
| 10,680,007 | B2 * | 6/2020 | Shin | H10D 30/025 |
| 10,861,931 | B2 * | 12/2020 | Lichtenwalner | H01L 21/046 |
| 11,894,457 | B2 * | 2/2024 | Ge | H10D 30/0289 |
| 12,148,754 | B2 * | 11/2024 | Sio | H10D 84/0193 |
| 2006/0214222 | A1 * | 9/2006 | Challa | H10D 84/144 257/E29.066 |
| 2006/0226439 | A1 * | 10/2006 | Robb | H10D 30/603 257/119 |
| 2007/0215940 | A1 * | 9/2007 | Ligon | H10B 41/30 257/341 |
| 2009/0045440 | A1 * | 2/2009 | Grivna | H10D 64/516 257/E29.345 |
| 2009/0242977 | A1 * | 10/2009 | Kawaguchi | H10D 30/025 257/330 |
| 2010/0123193 | A1 * | 5/2010 | Burke | H10D 84/038 257/334 |
| 2013/0043526 | A1 * | 2/2013 | Iyer | H10D 64/252 438/270 |
| 2014/0256103 | A1 * | 9/2014 | Kim | H10N 70/24 438/270 |
| 2016/0133742 | A1 * | 5/2016 | Okuda | H01L 23/544 438/270 |
| 2018/0040612 | A1 * | 2/2018 | Takahashi | H10D 62/107 |
| 2018/0212021 | A1 * | 7/2018 | Roig-Guitart | H10D 64/117 |
| 2019/0043421 | A1 * | 2/2019 | Yang | G09G 3/3291 |
| 2019/0067291 | A1 * | 2/2019 | Marzaki | H10D 1/692 |
| 2019/0206987 | A1 * | 7/2019 | Adachi | H10D 12/031 |
| 2019/0267449 | A1 * | 8/2019 | Chen | H10D 64/518 |
| 2019/0267486 | A1 * | 8/2019 | Ueno | H10D 62/393 |
| 2020/0075506 | A1 * | 3/2020 | Marzaki | H10B 99/14 |
| 2020/0161433 | A1 * | 5/2020 | Leendertz | H10D 30/0297 |
| 2020/0273858 | A1 * | 8/2020 | Nasu | H01L 23/5226 |
| 2021/0036104 | A1 * | 2/2021 | Santangelo | H10D 62/393 |
| 2021/0083061 | A1 * | 3/2021 | Darwish | H10D 62/127 |
| 2021/0296476 | A1 * | 9/2021 | Matsudai | H10D 62/107 |
| 2021/0305278 | A1 * | 9/2021 | Shiraki | H10D 84/038 |
| 2021/0373378 | A1 * | 12/2021 | Wu | G02F 1/13629 |
| 2021/0408235 | A1 * | 12/2021 | Cheng | H10D 30/6757 |
| 2022/0013645 | A1 * | 1/2022 | Shimosawa | H10D 64/231 |
| 2022/0130827 | A1 * | 4/2022 | Kim | H10D 84/038 |
| 2022/0254879 | A1 * | 8/2022 | Gauthier | H10D 10/421 |
| 2023/0411446 | A1 * | 12/2023 | Sampath | H10D 62/8503 |
| 2024/0234415 | A1 * | 7/2024 | Chu | H10D 84/853 |
| 2024/0243202 | A1 * | 7/2024 | Das | H10D 30/62 |
| 2024/0274086 | A1 * | 8/2024 | Wang | G02F 1/1362 |
| 2024/0357814 | A1 * | 10/2024 | Feng | H10B 43/30 |

FOREIGN PATENT DOCUMENTS

| | | |
|---|---|---|
| CN | 217182173 U | 8/2022 |
| FR | 3048103 A1 | 8/2017 |
| FR | 3069954 A1 | 2/2019 |
| FR | 3085540 A1 | 3/2020 |

OTHER PUBLICATIONS

CN First Office Action and Search Report for counterpart CN Appl. No. 202111231659.4, report dated Dec. 26, 2024, 11 pgs.

* cited by examiner

SEMICONDUCTOR INTEGRATED CIRCUIT COMPONENT

PRIORITY CLAIM

This application claims the priority benefit of French Application for Patent No. 2010911, filed on Oct. 23, 2020, the content of which is hereby incorporated by reference in its entirety to the maximum extent allowable by law.

TECHNICAL FIELD

Embodiments and implementations relate to integrated circuits and, more particularly, to semiconductor components for such integrated circuits.

BACKGROUND

Integrated circuits generally comprise a multitude of semiconductor components. These semiconductor components are configured to perform functions specific to them.

There are methods that allow for analyzing integrated circuits by reverse engineering, for example by analyzing in particular their semiconductor components.

In particular, some semiconductor components are visible on the surface of the integrated circuit, and therefore easily analyzed.

Analyzing an integrated circuit by third parties may be performed for the purpose of unauthorized reproduction of the integrated circuit. Such an analysis can also be performed in order to understand the operation of the integrated circuit. Once the operation of the integrated circuit is understood, it is possible to identify potential security vulnerabilities of the integrated circuit.

An integrated circuit that can be easily analyzed is therefore not sufficiently secure.

In order to improve the security of an integrated circuit, it is preferable to provide semiconductor components with a structure that allows to make analysis of the integrated circuit by reverse engineering more complex.

There is therefore a need to provide semiconductor components having a structure that is difficult to analyze and/or detect, or else having a complex operation.

There is also a need to provide such a semiconductor component which is simple to manufacture.

SUMMARY

According to one aspect, an integrated circuit comprises: a semiconductor substrate and a semiconductor component including: a buried semiconductor region disposed in the semiconductor substrate and having a first type of conductivity; a first gate region and a second gate region disposed at a distance from each other and each extending respectively in depth into the substrate from a front face of the semiconductor substrate to the buried semiconductor region; a third gate region extending in depth into the semiconductor substrate from its front face and being configured to be electrically connected to the buried semiconductor region; and an active area of the semiconductor substrate delimited by the first gate region, the second gate region and the buried semiconductor region, the active area having a second type of conductivity opposite to the first type of conductivity.

Such a semiconductor component is configured to have different functions according to different bias voltages which can be applied to its third gate region, but also to the first and second gate region. These different functions will be detailed below.

In particular, the voltages applied to the first gate region, the second gate region and the third gate region can act on a state of conductivity of the active area.

Such a semiconductor component therefore has buried gate regions as well as an active area which is also buried. Because the gate regions as well as the active area are buried, the semiconductor component is difficult to detect from the front face of the semiconductor substrate.

Furthermore, because the semiconductor component is configured to be able to perform multiple functions depending on the voltages that are applied to its gate regions, the behavior of the semiconductor component is difficult to analyze by reverse engineering.

Preferably, the semiconductor substrate comprises a well of the second conductivity type. The buried semiconductor region is then located in this well, the active area being comprised in the well.

The use of such a well makes it easier to adjust the doping in the active area during the manufacture of the semiconductor component.

Alternatively, it is possible to provide a semiconductor substrate already having the desired doping for said active area. However, the use of a well allows for making it more difficult to measure by a third party the doping concentration of the active area, and therefore making it more difficult to possibly reproduce the integrated circuit by a third party. Furthermore, the use of a well allows the proposed electronic component to be isolated from other components of the integrated circuit.

Advantageously, the semiconductor component further comprises an input and an output located between the first gate region and the second gate region and at a distance from each other, the active area including: a channel configured to be formed between said input and said output; and depleted areas around the channel.

Depleted areas are also designated by a person skilled in the art by the expressions "depletion areas", "space-charge areas", or else "deserted areas", and correspond to the region devoid of free carriers which appears in a MOS (Metal Oxide Semiconductor) structure or in a PN junction, between the N-doped region and the P-doped region.

The voltages applied to the first gate region, the second gate region and the third gate region allow to act on the depleted areas so that the channel can be closed or opened.

Thus, the voltage, depending on whether it has been imposed or not, or the electric current, depending on whether it has been imposed or not, at the output of the semiconductor component depend on the voltages applied to these three bias gates.

Preferably, the integrated circuit is configured to be able to apply either a rated voltage or a zero voltage to the first and second gate regions.

Furthermore, preferably, the integrated circuit is configured to be able to apply a predefined voltage to said input of the semiconductor component. This voltage is advantageously applied continuously to the input of the semiconductor component when the latter is in use. It can typically be around 1.2 Volts.

When the channel is closed, the voltage on the output is in a lower state than the voltage on the input.

In an advantageous embodiment, the first gate region and the second gate region each have a distal end including a gate oxide layer in contact with the semiconductor substrate and the buried semiconductor region.

Moreover, advantageously, the third gate region has a distal end including a gate oxide layer in contact with the buried semiconductor region, the third gate region having the same type of conductivity as the buried semiconductor region. Thus, the third gate region is configured to be electrically connected to the buried semiconductor region.

In an advantageous embodiment, the integrated circuit comprises at least one shallow isolation trench formed in the semiconductor substrate above the buried semiconductor region, the first gate region and the second gate region extending in depth into the substrate through a shallow isolation trench to the buried semiconductor region.

The gate oxide layers of the first gate region and the second gate region are then located under the shallow isolation trench.

In an advantageous embodiment, the buried semiconductor region comprises: an isolating semiconductor layer extending through the semiconductor substrate parallel to its front face, the third gate region being connected to this isolating semiconductor layer; and two regions having the first type of conductivity and protruding from the isolating semiconductor layer, the isolating semiconductor layer connecting these two regions, the first gate region extending in depth to one of these two regions and the second gate region extending in depth to the other of these two regions.

The active area is then delimited by these two regions, by the isolating semiconductor layer between these two regions and by the first gate region and the second gate region.

The oxide layers of the first and second gate regions can then be in contact with the region to which this gate region is connected.

In particular, preferably, the third gate region then has a distal end in contact with the isolating semiconductor layer.

Such an integrated circuit thus allows for the use of an isolating semiconductor layer to be able to electrically connect the third gate region to the two regions. Such an integrated circuit therefore facilitates the electrical connection of the third gate region to the two regions.

Alternatively, the buried semiconductor region comprises two joined regions having the first conductivity type, the first gate region extending in depth to one of these two regions and the second gate region extending in depth to the other of these two regions, the third gate region being connected to these two regions.

The active area is then delimited by these two regions, and by the first gate region and the second gate region.

The oxide layers of the first and second gate regions can then be in contact with the region to which this gate region is connected.

In particular, preferably, the third gate region then has a distal end in contact with the two regions.

Such an integrated circuit has the advantage of being able to dispense with an isolating semiconductor layer in order to be able to connect the third gate region to the two regions. This embodiment further allows a significant gain in surface area and easy integration of the proposed electronic component among libraries of elementary logic gate cells ("standard cells"). Indeed, the production of a deep isolating semiconductor layer requires an implantation of high energy dopants through the silicon and therefore the use of a thick photolithographic resin to protect the non-implanted areas. To obtain industrial photographic depth of field, this requires a wide opening of the resin and therefore the presence of an isolating semiconductor layer over a large surface of the silicon wafer.

The semiconductor component can be configured to be able to perform several functions.

In particular, advantageously, the semiconductor component is configured such that the depleted areas around the channel are joined only when the first gate region and the second gate region are powered with a rated voltage and the third gate region is powered with a first bias voltage.

Thus, by applying the first bias voltage to the third gate region, the channel is closed only when a rated voltage is applied to the first and second gate regions, otherwise the channel is open. The voltage on the output of the semiconductor component is therefore low only when a rated voltage is applied to the first and second gate regions.

Thus, when said first bias voltage is applied to said third gate region, the semiconductor component has the function of a NAND gate taking as input the voltages applied to the first and second gate regions.

The first bias voltage is, for example, equal to 1.2V.

In an advantageous embodiment, the semiconductor component is configured such that the depleted areas around the channel are separated only when the first gate region and the second gate region are not powered and the third gate region is powered with a second bias voltage.

Thus, by applying the second bias voltage to the third gate region, the channel is opened only when zero voltage is applied to the first and second gate regions, otherwise the channel is closed. The voltage on the output of the semiconductor component is therefore high only when zero voltage is applied to the first and second gate regions.

Thus, when said second bias voltage is applied to said third gate region, the semiconductor component has the function of a NOR gate taking as input the voltages applied to the first and second gate regions.

Advantageously, the second bias voltage is greater than the first bias voltage. For example, the second bias voltage is equal to 1.8V.

In an advantageous embodiment, the semiconductor component is configured such that the depleted areas are always separated when the third gate region is powered with a third bias voltage.

Thus, by applying the third bias voltage to the third gate region, the channel is opened regardless of the voltage applied to the first and second gate regions.

Thus, when said third bias voltage is applied to said third gate region, the channel of the semiconductor component acts as a resistance between the input and the output.

Furthermore, depending on the voltages applied to the first and second gate regions capable of acting on the depleted areas, the channel may not be fully open. The semiconductor component can therefore be used as a variable resistance.

For example, the resistance of the channel can, in particular, be set between 500 Ohm and 1 MOhm.

Advantageously, the third bias voltage is lower than the first bias voltage.

The behavior of the active area can be adapted by adjusting, for example, its doping and the dimensions of its cross section, defined in particular by the distance between the first and second gate regions and the distance between a bottom of the shallow isolation trench and the buried semiconductor region.

In particular, in an advantageous embodiment, the active area, in particular the channel, has a doping comprised between $10^{15}$ at/cm$^3$ and $10^{19}$ at/cm$^3$, for example of the order of $10^{17}$ at/cm$^3$. In particular, such doping allows to facilitate depletion in the active area.

Preferably, the first gate region is spaced from the second gate region by a distance comprised between 50 nm and 1 µm, for example of the order of 150 nm.

In an advantageous embodiment, the buried semiconductor region is spaced from a distal end of the shallow isolation trench by a distance comprised between 50 nm and 800 nm, for example of the order of 200 nm.

In an advantageous embodiment, the integrated circuit comprises a second semiconductor component including: a buried semiconductor region disposed in the semiconductor substrate and having a first type of conductivity; a first gate region and a second gate region disposed at a distance from each other and each extending respectively in depth into the substrate from a front face of the semiconductor substrate to the buried semiconductor region; a third gate region extending in depth into the semiconductor substrate from its front face and being configured to be electrically connected to the buried semiconductor region; an active area of the semiconductor substrate delimited by the first gate region, the second gate region and the buried semiconductor region, the active area having a second type of conductivity opposite to the first type of conductivity; and an isolation region having the first type of conductivity extending into the active area between the first gate region and the second gate region.

The second semiconductor component therefore differs from the first semiconductor component in that it comprises an isolation region across the active region, between the first and second gate regions.

This isolation region support preventing current from flowing between the input and output of the semiconductor component. This isolation region can therefore electrically disconnects the input from the output of the semiconductor component.

Such a second semiconductor component is therefore not adapted for performing the functions that can be performed by the first semiconductor component.

Such a semiconductor component can be used to complicate the analysis of the integrated circuit by reverse engineering. Indeed, such a second semiconductor component is difficult to distinguish from the first semiconductor component but cannot perform the same functions as the first semiconductor component.

According to another aspect, provision is made of a method for manufacturing a semiconductor component in a semiconductor substrate, the method comprising: forming a buried semiconductor region in the semiconductor substrate, this buried semiconductor region having a first type of conductivity; forming a first gate region and a second gate region at a distance from each other so that they each extend respectively in depth in the substrate from a front face of the semiconductor substrate to the buried semiconductor region; forming an active area of the semiconductor substrate delimited by the first gate region, the second gate region and the buried semiconductor region and having a second type of conductivity opposite to the first type of conductivity; and forming a third gate region electrically connected to the buried semiconductor region.

BRIEF DESCRIPTION OF THE DRAWINGS

Other advantages and features of the invention will become apparent upon examining the detailed description of implementations and embodiments, which are in no way limiting, and the appended drawings wherein.

DETAILED DESCRIPTION

Figure 1:
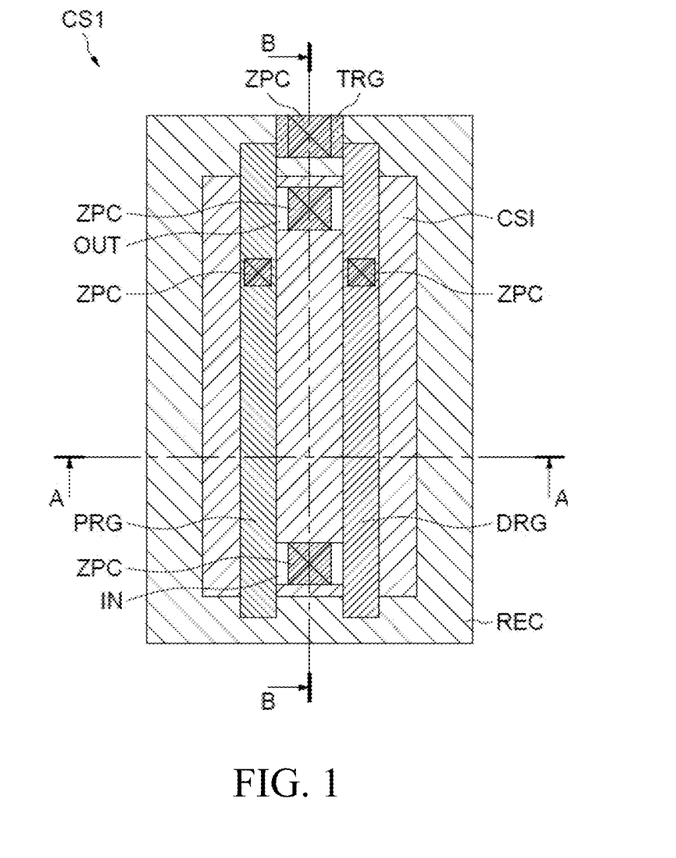
FIGS. 1 to 3 illustrate an integrated circuit comprising a semiconductor component according to a first embodiment.
Figure 2:
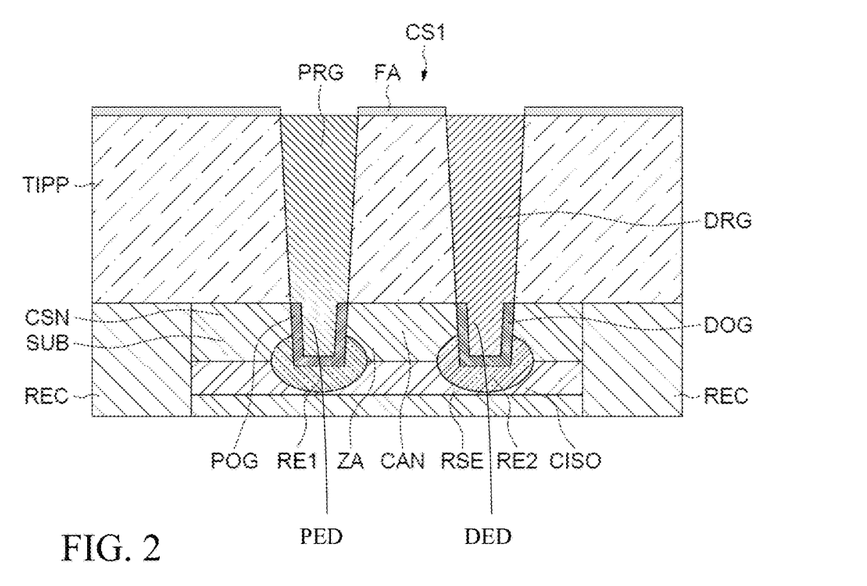
Figure 3:
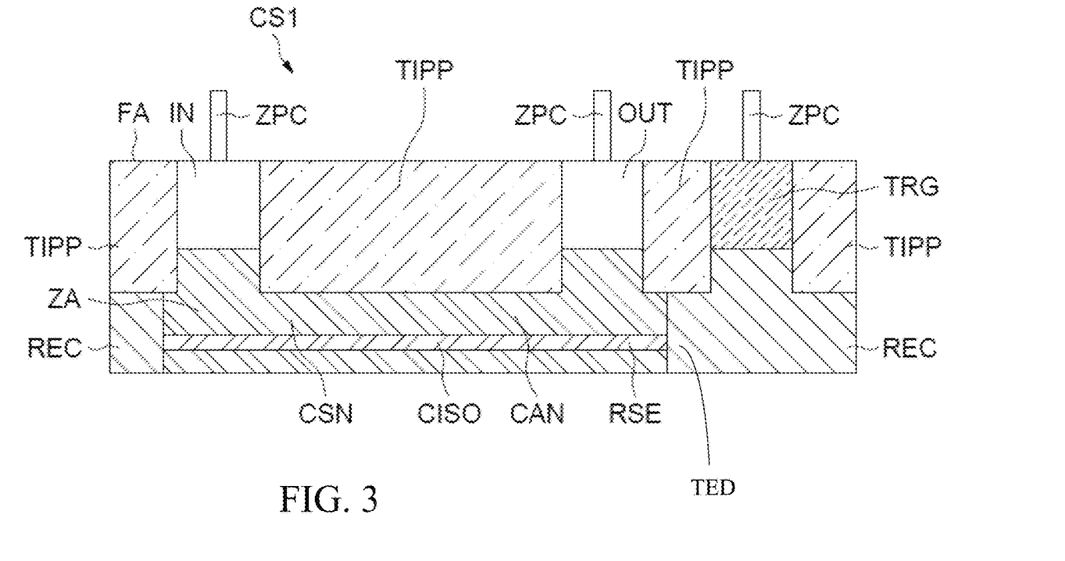

FIGS. 1 to 3 illustrate an integrated circuit comprising a semiconductor component CS1 according to a first embodiment. FIG. 1 is a top view of the semiconductor component CS1. FIG. 2 is a view of the semiconductor component CS1 along section A-A shown in FIG. 1. FIG. 3 is a view of the semiconductor component CS1 along section B-B shown in FIG. 1.

The integrated circuit CI comprises a semiconductor substrate SUB.

The semiconductor substrate SUB has a front face FA.

The semiconductor component CS1 comprises a semiconductor region RSE buried in the semiconductor substrate SUB. This buried semiconductor region RSE has a first type of conductivity, preferably of N type.

The semiconductor substrate SUB also comprises a well CSN having a second type of conductivity, for example of P type, opposite to the first type of conductivity. The well CSN extends in depth into the substrate SUB from its front face FA.

The integrated circuit IC also comprises a shallow isolation trench TIPP (also known by the acronym STI for "Shallow Trench Isolation"). This shallow isolation trench TIPP extends in depth into the semiconductor substrate SUB from its front face FA to a distal end. This shallow isolation trench TIPP extends into the semiconductor substrate SUB less deeply than the well CSN. The well CSN thus surrounds the shallow isolation trench TIPP.

The well CSN preferably has, in the vicinity of the isolating layer TIPP, a doping comprised between $10^{15}$ at/cm$^3$ and $10^{19}$ at/cm$^3$, for example of the order of $10^{17}$ at/cm$^3$.

The shallow isolation trench TIPP can extend in depth into the semiconductor substrate SUB for a distance comprised between 200 nm and 500 nm, for example of the order of 350 nm.

The shallow isolation trench TIPP is formed from a dielectric material such as silicon dioxide.

The semiconductor component CS1 can be used to perform various functions which will be detailed below.

In this first embodiment, the buried semiconductor region RSE comprises an isolating semiconductor layer CISO. This isolating semiconductor layer CISO therefore has the first type of conductivity. This isolating semiconductor layer CISO extends parallel to the front face FA of the semiconductor substrate SUB.

In particular, this isolating semiconductor layer CISO extends directly under the well CSN. This isolating semiconductor layer CISO is therefore located at least in part under the shallow isolation trench TIPP.

For example, this isolating semiconductor layer CISO is located at a distance comprised between 500 nm and 2000 nm relative to the front face FA of the semiconductor substrate SUB. In particular, the semiconductor layer is spaced from a distal end of the shallow isolation trench TIPP by a distance comprised between 50 nm and 800 nm, for example of the order of 200 nm.

Preferably, this isolating semiconductor layer CISO has a doping comprised between $10^{16}$ at/cm$^3$ and $10^{19}$ at/cm$^3$, for example of the order of $10^{17}$ at/cm$^3$.

Furthermore, the buried semiconductor region RSE comprises two regions RE1, RE2 protruding from the isolating semiconductor layer CISO. These two regions RE1, RE2 also have the first type of conductivity.

These two regions RE1, RE2 are located under the shallow isolation trench TIPP.

Preferably, these two regions RE1, RE2 have a doping comprised between $10^{17}$ at/cm$^3$ and $10^{20}$ at/cm$^3$, for example of the order of $3\times10^{18}$ at/cm$^3$.

The semiconductor component CS1 further comprises a first gate region PRG and a second gate region DRG.

The first gate region PRG extends in depth into the semiconductor substrate SUB through the shallow isolation trench TIPP, to a distal end PED located below the shallow isolation trench TIPP in contact with the well CSN and the region RE1.

The second gate region DRG extends in depth into the semiconductor substrate SUB through the shallow isolation trench TIPP, to a distal end DED located below the shallow isolation trench TIPP in contact with the well CSN and the region RE2.

In particular, the first gate region PRG and the second gate region DRG extend in depth over a distance comprised between 300 nm and 700 nm, for example of the order of 500 nm.

The first gate region PRG and the second gate region DRG have a width comprised between 40 nm and 400 nm, for example of the order of 70 nm.

The first gate region PRG and the second gate region DRG extend parallel in length in the semiconductor substrate SUB.

The first gate region PRG is spaced from the second gate region DRG by a distance comprised between 50 nm and 1 µm, for example of the order of 150 nm.

The first gate region PRG and the second gate region DRG are formed from polysilicon.

The distal end PED of the first gate region PRG and the distal end DED of the second gate region DRG comprise a gate oxide layer POG, DOG against the well CSN and the regions RE1, RE2 respectively. These oxide layers POG, DOG can also extend over the sides of the first and second gate regions PRG, DRG.

The semiconductor component CS1 also comprises a third gate region TRG having the first type of conductivity, in particular of the N+ type. This third gate region TRG extends in depth into the substrate to a distal end TED in contact with the isolating semiconductor layer CISO of the same conductivity type.

In particular, the third gate region TRG is formed in a region REC having the first type of conductivity surrounding the first gate region PRG and the second gate region DRG.

The region REC has a doping comprised between $10^{15}$ at/cm$^3$ and $10^{19}$ at/cm$^3$, for example of the order of $10^{17}$ at/cm$^3$.

The third gate region TRG has a doping comprised between $10^{16}$ at/cm$^3$ and $10^{20}$ at/cm$^3$, for example of the order of $10^{17}$ at/cm$^3$ in the isolating semiconductor area remote from the front face FA, but of the order of $5\times10^{19}$ at/cm$^3$ near the surface of the front face FA.

Moreover, the semiconductor component CS1 also comprises contact areas ZPC on the first, second and third gate regions PRG, DRG, TRG as well as on the input IN and the output OUT.

The semiconductor component then comprises an area, called active area ZA, of the well CSN delimited by the isolating semiconductor layer CISO, by the regions RE1, RE2, by the first and second gate regions PRG, DRG and by the shallow isolation trench TIPP.

The active area ZA comprises a channel CAN having the second type of conductivity and depleted areas (not shown). The depleted areas are located between the two regions RE1, RE2 and the channel CAN as well as between the isolating semiconductor layer CISO and the channel CAN.

In particular, the more the voltages applied to the gate regions are increased, the more the depleted areas in the active area are increased so as to reduce the section of the channel.

More particularly, the integrated circuit is configured so that the first and second gate regions can be powered with a rated voltage. Preferably, this rated voltage is of the order of 1.1V.

The semiconductor component CS1 is configured so that it can perform several functions by modifying the state of the active area ZA.

The semiconductor component CS1 is configured so that it is possible to change the behavior of the channel CAN according to the voltage applied to the third gate region TRG.

Thus, the semiconductor component CS1 is configured to be able to perform several functions by modifying the behavior of the channel CAN.

In particular, the voltages applied to the first, second and third gate regions PRG, DRG and TRG can act on the depleted areas of the active area ZA.

More particularly, when the voltages applied to the first, second and third gate regions PRG, DRG and TRG are zero, the depleted areas are sufficiently minimal for the channel CAN to be open so as to allow current to flow between the input IN and output OUT.

Furthermore, the semiconductor component CS1 can be configured to operate as a NAND logic gate when the voltage applied to the third gate region TRG is equal to a first bias voltage. The inputs of this logic gate are then the voltages applied to the first and second gate regions PRG and DRG, and the output of the logic gate is the output OUT.

This first bias voltage can, for example, be equal to 1.2V.

In particular, when the first bias voltage is applied to the third gate region TRG, the depleted areas around the channel CAN are joined only when the first gate region PRG and the second gate region DRG are powered with the rated voltage.

In this case, the channel CAN is therefore closed only when the rated voltage is applied to the first and second gate regions PRG and DRG, otherwise the channel CAN is open. The voltage on the output OUT of the semiconductor component CS1 is therefore low only when the rated voltage is applied to the first and second gate regions PRG and DRG. When zero voltage is applied to the first gate region and/or the second gate region PRG, DRG, the voltage on the output OUT is high.

Furthermore, the semiconductor component CS1 can be configured to operate as a NOR gate when the voltage applied to the third gate region TRG is equal to a second bias voltage. The inputs of this logic gate are then the voltages applied to the first and second gate regions PRG and DRG, and the output of the logic gate is the output OUT.

This second bias voltage can, for example, be equal to 1.8V.

In particular, when this second bias voltage is applied to the third gate region TRG, the depleted areas around the channel CAN are separated only when the first gate region PRG and the second gate region DRG are not powered.

In this case, the channel CAN is therefore open only when the first gate region PRG and the second gate region DRG are not powered, otherwise the channel CAN is closed. The voltage on the output OUT of the semiconductor component is therefore high only when zero voltage is applied to the first and second gate regions PRG, DRG. When the rated voltage is applied to the first gate region and/or the second gate region PRG, DRG, the voltage on the output OUT is low.

Furthermore, the semiconductor component CS1 can be configured to operate as a variable resistance when the voltage applied to the third gate region TRG is equal to a third bias voltage. The variable resistance is then formed by the channel CAN between the input IN and the output OUT.

This third bias voltage can, for example, be equal to 0.6V.

In particular, when the third bias voltage is applied to the third gate region TRG, the depleted areas are always separated.

Thus, by applying the third bias voltage to the third gate region TRG, the channel CAN is opened regardless of the voltage applied to the first and second gate regions PRG and DRG.

However, it is still possible to act on the resistance of the channel CAN by acting on the depleted areas. Thus, it is possible to vary the resistance of the channel according to the voltages applied to the first and second gate regions PRG and DRG.

For example, the resistance of the channel CAN can, in particular, be set between 500 Ohm and 1 MOhm.

Figure 4:
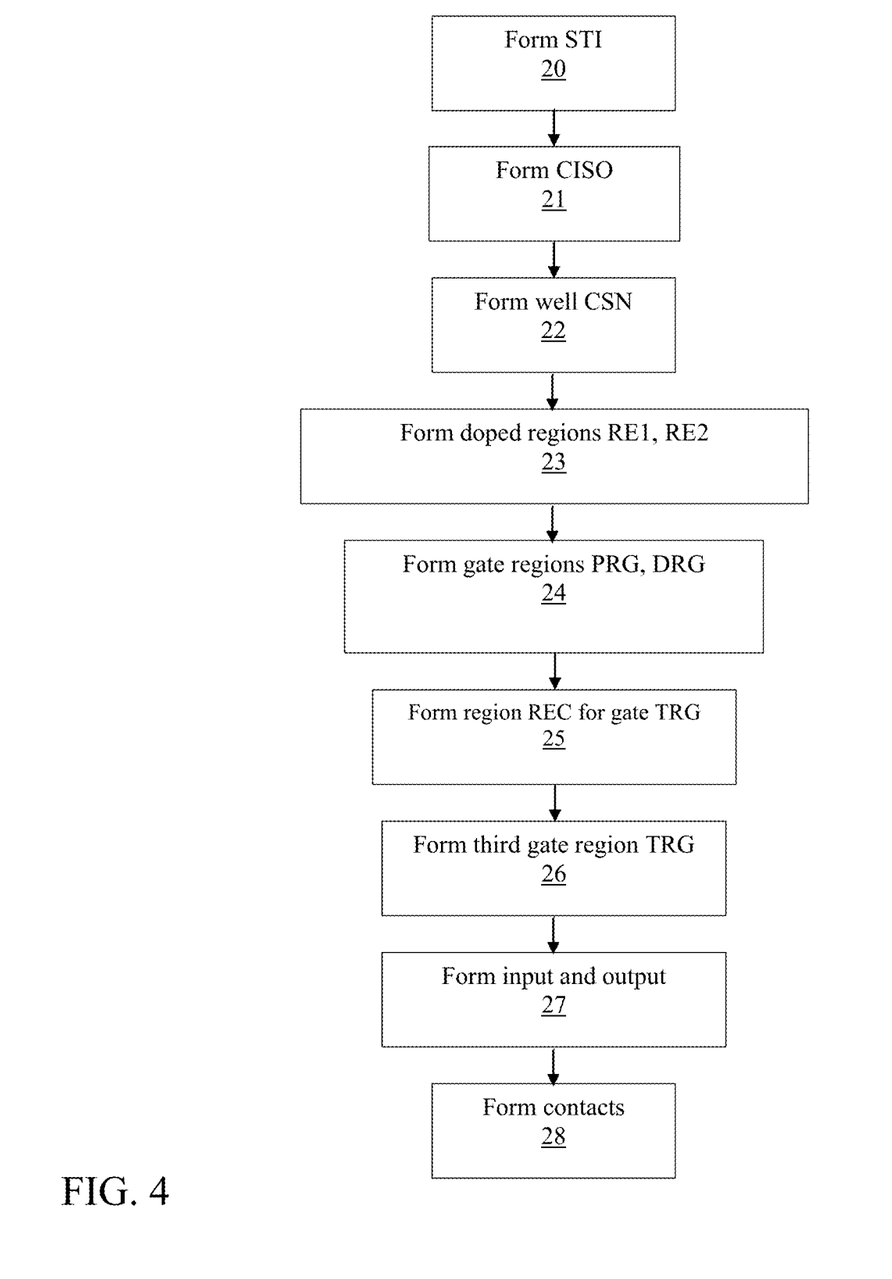
FIG. 4 illustrates an embodiment of a manufacturing method that can be used to obtain the semiconductor component shown in FIGS. 1 to 3.

FIG. 4 illustrates an embodiment of a manufacturing method that can be used to obtain the semiconductor component CS1 shown in FIGS. 1 to 3.

The manufacturing method comprises a step 20 of forming the shallow isolation trenches TIPP in the semiconductor substrate SUB.

The manufacturing method then comprises a step 21 of forming the isolating semiconductor layer CISO in the semiconductor substrate SUB by implanting dopants of the first conductivity type.

The manufacturing method then comprises a step 22 of forming the well CSN in the semiconductor substrate SUB by implanting dopants of the second conductivity type.

The manufacturing method then comprises a step 23 of forming the two regions RE1, RE2 in the semiconductor substrate by implanting the first type of conductivity.

The manufacturing method then comprises a step 24 of forming the first and second gate regions PRG, DRG.

The step 24 of forming the first and second gate regions PRG, DRG comprises an etching of two trenches extending parallel to one another from the front face of the semiconductor substrate to the regions RE1, RE2, passing through the shallow isolation trenches TIPP. The trenches then define the contours of the first and second gate regions PRG, DRG. This step 24 also comprises forming a gate oxide layer POG, DOG on the sides of the trenches, in particular against the regions RE1, RE2. This step further comprises depositing polysilicon filling the trenches.

The manufacturing method also comprises a step 25 of forming the region REC by implanting dopants having the first type of conductivity.

The manufacturing method also comprises a step 26 of forming the third gate region TRG by implanting dopants having the first type of conductivity in the region REC.

The manufacturing method also comprises a step 27 of forming the input IN and the output OUT by implanting dopants having the second type of conductivity.

The manufacturing method then comprises a step 28 of forming the contact areas ZPC of the first, second and third gate regions PRG, DRG, TRG and contact areas ZPC of the input IN and of the output OUT.

Figure 5:
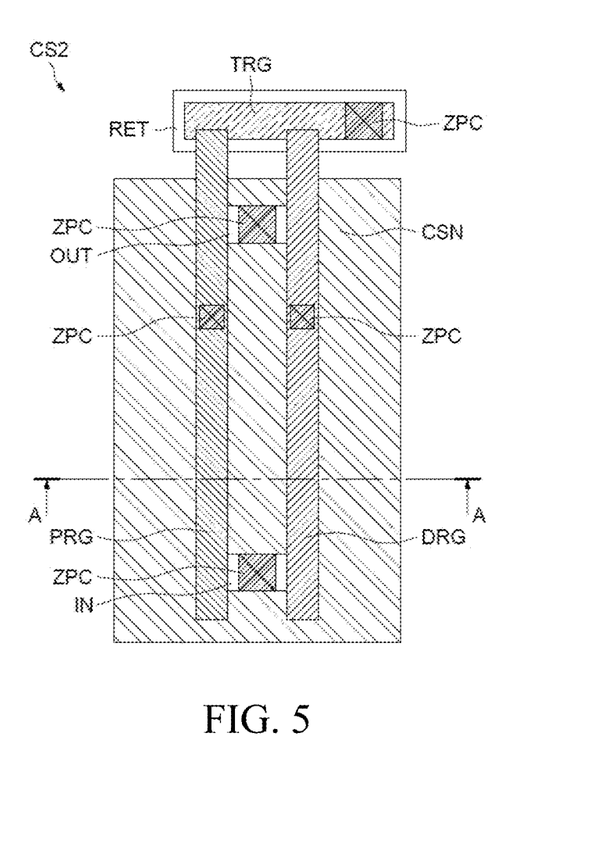
FIGS. 5 and 6 illustrate a semiconductor component according to another embodiment.
Figure 6:
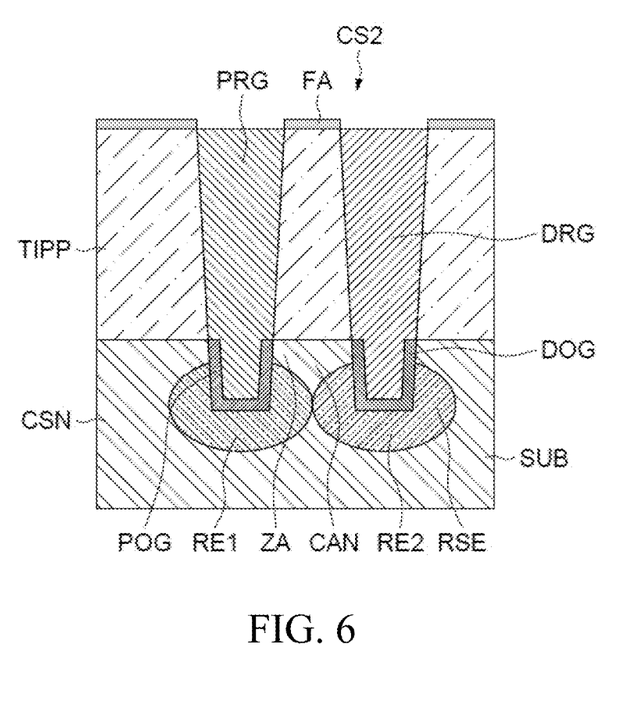

FIGS. 5 and 6 illustrate a semiconductor component CS2 according to another embodiment. FIG. 5 is a top view of the semiconductor component CS2. FIG. 6 is a view of the semiconductor component CS2 along section A-A shown in FIG. 5.

In this embodiment, the semiconductor component CS2 is formed in the semiconductor substrate SUB.

This embodiment differs from that illustrated in FIG. 1 in that no isolating semiconductor layer CISO is used to electrically connect the third gate region TRG to the regions RE1 and RE2.

Indeed, in this embodiment, the buried semiconductor region RSE comprises only joined regions RE1 and RE2.

Thus, the semiconductor component CS2 therefore comprises a first gate region PRG and a second gate region DRG extending in depth into the semiconductor substrate SUB through a shallow isolation trench from a front face FA of the semiconductor substrate SUB. The first and second gate regions PRG and DRG respectively comprise a gate oxide layer POG, DOG at their distal end.

In particular, the shallow isolation trench TIPP extends in depth into the semiconductor substrate SUB from a front face FA of the semiconductor substrate SUB.

The third gate region TRG then extends into the semiconductor substrate SUB to a distal end in contact with at least one of the regions RE1, RE2.

In particular, the third gate region TRG is formed in a semiconductor region RET extending in depth into the semiconductor substrate SUB and having the first type of conductivity. In particular, this semiconductor region RET extends in length orthogonally to the first and second gate regions.

As for the semiconductor component CS1, the semiconductor component CS2 comprises a well CSN wherein the buried semiconductor region is formed. The semiconductor component CS2 also comprises an input IN and an output OUT formed between the first gate region and the second gate region.

The semiconductor component CS2 therefore comprises an active area ZA of the well CSN delimited by the regions RE1, RE2, by the first and second gate regions PRG, DRG and by the shallow isolation trench TIPP.

The active area ZA comprises a channel CAN having the second type of conductivity between the input IN and the output OUT and depleted areas (not shown). The depleted areas are located between the two regions RE1, RE2 and the channel CAN.

The semiconductor component CS2 is configured to be able to perform the same functions as the semiconductor component CS1, in particular in the same manner as described above for the semiconductor component CS1.

Figure 7:
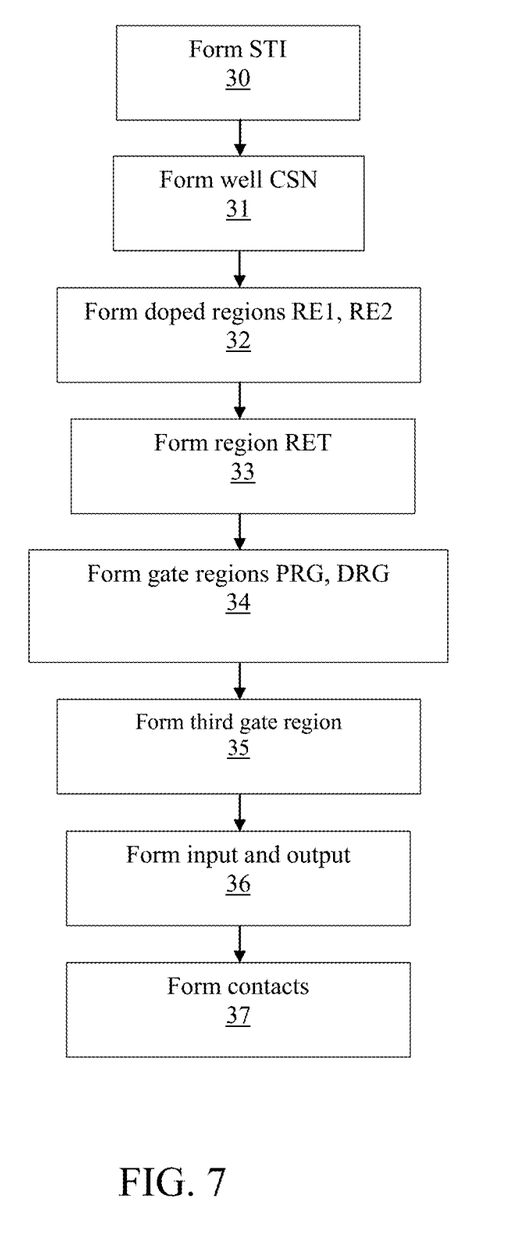
FIG. 7 illustrates one embodiment of a manufacturing method that can be used to obtain the semiconductor component shown in FIGS. 5 to 6.

FIG. 7 illustrates one embodiment of a manufacturing method that can be used to obtain the semiconductor component CS2 shown in FIGS. 5 to 6.

The manufacturing method comprises a step 30 of forming the shallow isolation trenches TIPP.

The manufacturing method then comprises a step 31 of forming the well CSN in the semiconductor substrate SUB by implanting the second type of conductivity.

The manufacturing method then comprises a step 32 of forming the two regions RE1, RE2 in the semiconductor substrate SUB by implanting the first type of conductivity.

The manufacturing method also comprises a step 33 of forming the semiconductor region RET by implanting dopants of the first conductivity type.

The manufacturing method then comprises a step 34 of forming the first and second gate regions PRG, DRG.

The step 34 of forming the first and second gate regions PRG, DRG comprises an etching of two trenches extending parallel to one another from the front face of the semiconductor substrate SUB to the regions RE1, RE2, passing through the shallow isolation trenches TIPP. The trenches then define the contours of the first and second gate regions PRG, DRG. This step 34 also comprises forming a gate oxide layer POG, DOG in the trenches, against the regions RE1, RE2. This step further comprises depositing polyzilicon filling the trenches.

The manufacturing method also comprises a step 35 of forming the third gate region TRG by implanting dopants having the second type of conductivity in the semiconductor region RET.

The manufacturing method also comprises a step 36 of forming the input IN and the output OUT by implanting dopants having the second type of conductivity.

The manufacturing method then comprises a step 37 of forming the contact areas ZPC of the first, second and third gate regions PRG, DRG, TRG and contact areas ZPC of the input and the output.

Figure 8:
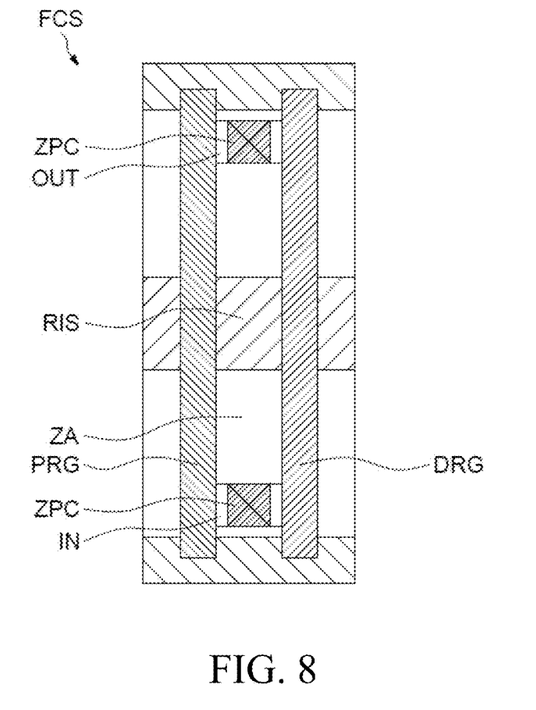
FIG. 8 illustrates a top view of a semiconductor component formed in a semiconductor substrate.

Moreover, FIG. 8 illustrates a top view of a semiconductor component FCS formed in a semiconductor substrate SUB.

This semiconductor component FCS comprises a first gate region PRG and a second gate region DRG extending in depth into the semiconductor substrate SUB through a shallow isolation trench (not shown).

In particular, the shallow isolation trench TIPP extends in depth into the semiconductor substrate SUB from a front face FA of the semiconductor substrate SUB.

The semiconductor component FCS also comprises a semiconductor region buried under the shallow isolation trench. This buried semiconductor region may be identical to that of the semiconductor component CS1 shown in FIGS. 1 to 3 or to that of the semiconductor component CS2 shown in FIGS. 5 and 6.

The semiconductor component FCS may also comprise a third gate region (not shown) which then extends into the semiconductor substrate to a distal end in contact with the buried semiconductor region.

As for the semiconductor components CS1 and CS2, the semiconductor component FCS comprises a well (not shown) wherein the buried semiconductor region is formed. The semiconductor component FCS also comprises an input IN and an output OUT formed between the first gate region and the second gate region PRG and DRG.

The semiconductor component FCS therefore comprises an active area ZA of the well delimited by the buried semiconductor region, by the first and second gate regions PRG, DRG and by the shallow isolation trench.

The active area ZA comprises a channel having the second type of conductivity between the input IN and the output OUT and depleted areas. The depleted areas are located between the buried semiconductor region and the channel.

The semiconductor component FCS further comprises an isolation region RIS having the first conductivity type extending into the active area ZA between the first gate region PRG and the second gate region DRG.

This isolation region RIS allows to prevent current from flowing between the input IN and the output OUT of the semiconductor component FCS. This isolation region RIS therefore allows to electrically disconnect the input IN from the output OUT of the semiconductor component FCS.

Such a semiconductor component FCS is therefore not adapted for performing the functions that can be performed by the semiconductor components CS1, CS2 as shown in FIG. 1 to 3 or 5 and 6.

Figure 9:
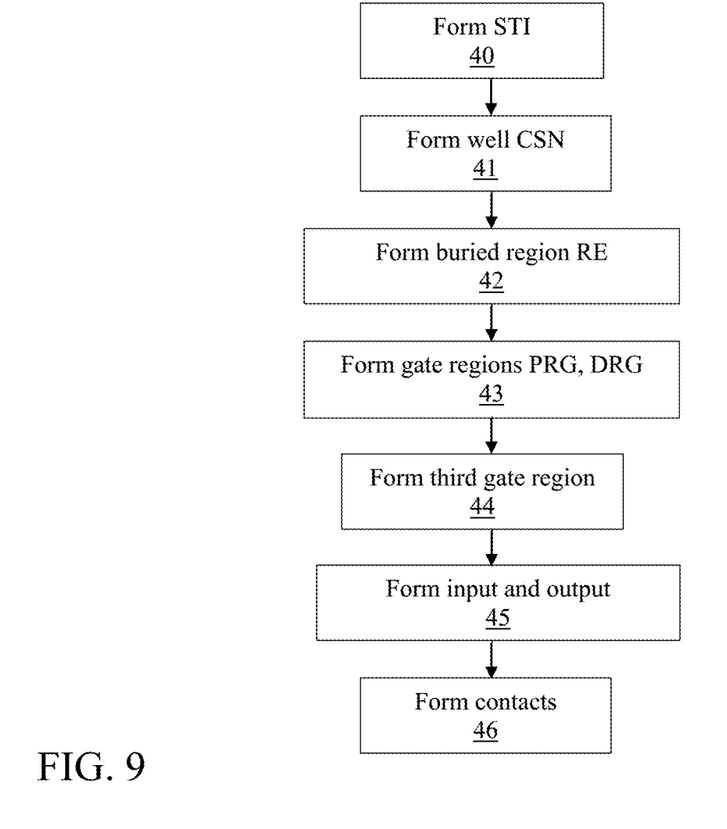
FIG. 9 illustrates an implementation of a manufacturing method that can be used to obtain the semiconductor component shown in FIG. 8.

FIG. 9 illustrates an implementation of a manufacturing method that can be used to obtain the semiconductor component FCS shown in FIG. 8.

The manufacturing method comprises a step 40 of forming the shallow isolation trenches TIPP.

The manufacturing method comprises a step 41 of forming the well CSN in the semiconductor substrate by implanting the second type of conductivity.

The manufacturing method then comprises a step 42 of forming the buried semiconductor region RE in the semiconductor substrate by implanting the first type of conductivity.

The manufacturing method then comprises a step 43 of forming the first and second gate regions PRG, DRG.

The step 43 of forming the first and second gate regions PRG, DRG comprises an etching of two trenches extending parallel to one another from the front face FA of the semiconductor substrate SUB to the buried semiconductor region RE, passing through the shallow isolation trenches. The trenches then define the contours of the first and second gate regions PRG, DRG. This step 43 also comprises forming a gate oxide layer in the trenches, against the buried semiconductor region RE. This step further comprises depositing polysilicon filling the trenches.

The manufacturing method optionally comprises a step 44 of forming the third gate region TRG by implanting dopants having the first type of conductivity.

The manufacturing method also comprises a step 45 of forming the input IN and the output OUT by implanting dopants having the second type of conductivity.

The manufacturing method then comprises a step 46 of forming the contact areas ZPC of the first, second gate regions PRG, DRG, contact areas ZPC of the input IN and of the output OUT, and optionally a contact area for the third gate region.

Figure 10:
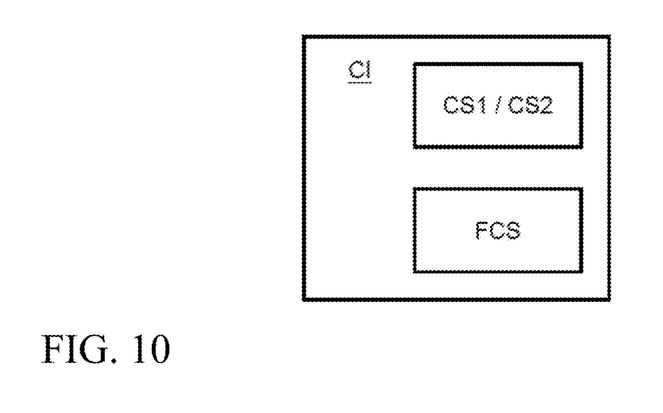
FIG. 10 illustrates an integrated circuit that includes at least one semiconductor component (such as those shown in FIG. 1 to 3 or 5 to 6) and at least one semiconductor component (such as that shown in FIG. 8).

Advantageously, as illustrated in FIG. 10, an integrated circuit CI can comprise at least one semiconductor component CS1, CS2 such as those shown in FIG. 1 to 3 or 5 to 6 and at least one semiconductor component FCS such as that shown in FIG. 8.

In such a circuit, it is difficult to differentiate the semiconductor components FCS from the semiconductor components CS1, CS2 by reverse engineering. Indeed, the semiconductor components FCS differ only from the semiconductor components CS1, CS2 in that they comprise an isolation region RIS across the active area ZA, between the first and second gate regions PRG, DRG.

This isolation region is difficult to detect.

As seen previously, this isolation region RIS prevents current from flowing between the input IN and the output OUT of the semiconductor component FCS. This isolation region RIS therefore allows to electrically disconnect the input IN from the output OUT of the semiconductor component FCS.

Such a semiconductor component FCS is therefore not adapted for performing the functions that can be performed by the semiconductor components CS1, CS2 Such a semiconductor component FCS can thus be used to complicate the analysis of the integrated circuit by reverse engineering. Indeed, such a semiconductor component FCS is difficult to distinguish from the semiconductor components CS1, CS2 but cannot perform the same functions as these semiconductor components CS1, CS2.

Of course, the embodiments herein are susceptible to various variations and modifications which will be apparent to a person skilled in the art. For example, in the embodiments detailed above the function of the electronic component is defined by the bias voltage applied by the third gate region. Nevertheless, it is quite possible to provide such an electronic component for which its function is defined according to the voltage applied to the first gate region or to the second gate region or else to the different voltages applied to the first, second and third gate regions.

The invention claimed is:

1. An integrated circuit, comprising:
   a semiconductor substrate; and
   a first semiconductor component including:
      a buried semiconductor region disposed in the semiconductor substrate and having a first type of conductivity;
      a first gate region and a second gate region disposed at a distance from each other and each extending respectively in depth into the semiconductor substrate from a front face of the semiconductor substrate to the buried semiconductor region;
      a third gate region extending in depth into the semiconductor substrate from the front face and electrically connected to the buried semiconductor region; and
      an active area of the semiconductor substrate delimited by the first gate region, the second gate region and the buried semiconductor region, the active area having a second type of conductivity opposite to the first type of conductivity;
      an input contact to the active area and an output contact to the active area located between the first gate region and the second gate region and at a distance from each other, the active area including:
         a channel between said input contact and said output contact; and
         depleted areas around the channel.

2. The integrated circuit according to claim 1, wherein the semiconductor substrate comprises a well of the second conductivity type and wherein the buried semiconductor region is located in the well, and wherein the active area is within the well.

3. The integrated circuit according to claim 1, wherein the first semiconductor component is configured such that the depleted areas around the channel are joined only when the first gate region and the second gate region are powered with a rated voltage and the third gate region is powered with a first bias voltage.

4. The integrated circuit according to claim 1, wherein the first semiconductor component is configured such that the depleted areas around the channel are separated only when the first gate region and the second gate region are not powered and the third gate region is powered with a second bias voltage.

5. The integrated circuit according to claim 1, wherein the first semiconductor component is configured such that the depleted areas are always separated when the third gate region is powered with a third bias voltage.

6. The integrated circuit according to claim 1, wherein the first gate region and the second gate region each have a distal end including a gate oxide layer in contact with the semiconductor substrate and the buried semiconductor region.

7. The integrated circuit according to claim 1, further comprising at least one shallow isolation trench located in the semiconductor substrate above the buried semiconductor region.

8. The integrated circuit according to claim 1, wherein the first gate region and the second gate region extend in depth into the substrate passing through a shallow isolation trench to the buried semiconductor region.

9. The integrated circuit according to claim 8, wherein a distal end of the shallow isolation trench is spaced from the buried semiconductor region by a distance of between 50 nm and 800 nm.

10. The integrated circuit according to claim 1, wherein the active area has a doping in a range between $10^{15}$ at/cm$^3$ and $10^{19}$ at/cm$^3$.

11. The integrated circuit according to claim 1, wherein the first gate region is spaced from the second gate region by a distance of between 50 nm and 1 µm.

12. The integrated circuit according to claim 1, further comprising a second semiconductor component including:
   a further buried semiconductor region disposed in the semiconductor substrate and having the first type of conductivity;
   a further first gate region and a further second gate region disposed at a distance from each other and each extending respectively in depth into the semiconductor substrate from the front face of the semiconductor substrate to the further buried semiconductor region;
   a further third gate region extending in depth into the semiconductor substrate and being configured to be electrically connected to the further buried semiconductor region;
   a further active area of the semiconductor substrate delimited by the further first gate region, the further second gate region and the further buried semiconductor region, the further active area having the second type of conductivity opposite to the first type of conductivity; and
   an isolation region having the first type of conductivity extending into the further active area between the further first gate region and the further second gate region.

13. An integrated circuit, comprising:
   a semiconductor substrate; and
   a first semiconductor component including:
   a buried semiconductor region disposed in the semiconductor substrate and having a first type of conductivity;
   a first gate region and a second gate region disposed at a distance from each other and each extending respectively in depth into the semiconductor substrate from a front face of the semiconductor substrate to the buried semiconductor region;
   a third gate region extending in depth into the semiconductor substrate from the front face and electrically connected to the buried semiconductor region; and
   an active area of the semiconductor substrate delimited by the first gate region, the second gate region and the buried semiconductor region, the active area having a second type of conductivity opposite to the first type of conductivity;

wherein the buried semiconductor region comprises:
an isolating semiconductor layer extending through the semiconductor substrate parallel to the front face, the third gate region being connected to this isolating semiconductor layer;

two regions having the first type of conductivity and protruding from the isolating semiconductor layer, the isolating semiconductor layer connecting these two regions, the first gate region extending in depth to one of these two regions and the second gate region extending in depth to the other of these two regions; and wherein the active area is delimited by said two regions, the isolating semiconductor layer between said two regions and the first gate region and the second gate region.

14. An integrated circuit, comprising:
a semiconductor substrate; and
a first semiconductor component including:
a buried semiconductor region disposed in the semiconductor substrate and having a first type of conductivity;
a first gate region and a second gate region disposed at a distance from each other and each extending respectively in depth into the semiconductor substrate from a front face of the semiconductor substrate to the buried semiconductor region;
a third gate region extending in depth into the semiconductor substrate from the front face and electrically connected to the buried semiconductor region; and
an active area of the semiconductor substrate delimited by the first gate region, the second gate region and the buried semiconductor region, the active area having a second type of conductivity opposite to the first type of conductivity;
wherein the buried semiconductor region comprises a first region and a second region, the first and second regions having the first conductivity type, joined by a doped layer of the first conductivity type, wherein the first gate region extends in depth to the first region and the second gate region extends in depth to the second region, and wherein the third gate region is electrically connected to first and second regions through the doped layer.

15. The integrated circuit according to claim 14, wherein the active area is delimited by these two joined regions, and the first gate region and the second gate region.

16. An integrated circuit, comprising:
a semiconductor substrate including well which includes an active area;
a buried semiconductor region disposed in the semiconductor substrate;
wherein the buried semiconductor region has a first type of conductivity and the well has a second type of conductivity;
an insulating region in a trench within the semiconductor substrate and extending over the well;
a first gate region and a second gate region disposed at a distance from each other and each extending respectively through the insulating region, through the well and into the buried semiconductor region;
wherein conductive portions of the first and second gate regions are insulated from the well and the buried semiconductor region by a gate insulating layer;
a third gate region extending through the insulating region to make electrical contact with the buried semiconductor region.

17. The integrated circuit of claim 16, wherein said buried semiconductor region is formed by a buried doped layer in the semiconductor substrate below said well.

18. The integrated circuit of claim 16, wherein said buried semiconductor region further comprises first and second doped regions below said first and second gate regions.

19. The integrated circuit of claim 16, wherein said buried semiconductor region is formed by first and second doped regions below said first and second gate regions, wherein said first and second doped regions are in contact with each other.

20. The integrated circuit of claim 16, further comprising an input and an output located between the first and second gate regions and separated from each other by said active area of the well that forms a channel.

21. The integrated circuit of claim 20, further comprising depleted areas around the channel.

22. The integrated circuit of claim 20, further comprising an isolating region of the first conductivity type located between the first and second gate regions and located between the input and the output.

23. An integrated circuit, comprising:
a semiconductor region having a first type of conductivity;
a semiconductor substrate having a second type of conductivity located above and below the semiconductor region;
wherein a portion of the semiconductor substrate located above the semiconductor region forms an active area;
a first gate region and a second gate region disposed at a distance from each other and each extending respectively in depth into the semiconductor substrate from a front face of the semiconductor substrate to the semiconductor region;
wherein a region of the active area located between the first and second gate regions forms a channel;
a first electrical contact to the active area at a first end of the channel;
a second electrical contact to the active area at a second end of the channel; and
a third gate region in electrical contact with the semiconductor region;
wherein the integrated circuit is as a logic gate with the third gate region biased at a bias voltage, input signals to the logic gate received at the first and second gate regions, and an output signal of the logic gate generated at the second electrical contact.

24. The integrated circuit of claim 23, wherein the logic gate is:
a NAND logic gate where the bias voltage is at a first bias level; and
a NOR logic gate where the bias voltage is at a second bias level different from the first bias level.

25. The integrated circuit of claim 23, further comprising:
two regions having the first type of conductivity and protruding from the semiconductor region, the semiconductor region electrically connecting said two regions;
wherein the first gate region extends in depth into one of said two regions;
wherein the second gate region extends in depth into the other of said two regions; and
wherein the channel is located between said two regions.

26. An integrated circuit, comprising:
a semiconductor region having a first type of conductivity;
a semiconductor substrate having a second type of conductivity located above and below the semiconductor region;
wherein a portion of the semiconductor substrate located above the semiconductor region forms an active area;
a first gate region and a second gate region disposed at a distance from each other and each extending respectively in depth into the semiconductor substrate from a front face of the semiconductor substrate to the semiconductor region;
wherein a region of the active area located between the first and second gate regions forms a channel;
a first electrical contact to the active area at a first end of the channel;
a second electrical contact to the active area at a second end of the channel; and
a third gate region in electrical contact with the semiconductor region;
wherein the integrated circuit is a variable resistor with the third gate region biased at a bias voltage, terminals of the variable resistor being at the first and second electrical contacts, and a variable control of a resistance of the variable resistor in response to control signals applied to the first and second gate regions.

27. The integrated circuit of claim 26, further comprising:
two regions having the first type of conductivity and protruding from the semiconductor region, the semiconductor region electrically connecting said two regions;
wherein the first gate region extends in depth into one of said two regions;
wherein the second gate region extends in depth into the other of said two regions; and
wherein the channel is located between said two regions.

* * * * *